United States Patent
Naito

(10) Patent No.: US 10,818,782 B2
(45) Date of Patent: Oct. 27, 2020

(54) INSULATED-GATE BIPOLAR TRANSISTOR (IGBT) INCLUDING A BRANCHED GATE TRENCH

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 141 days.

(21) Appl. No.: 15/826,666

(22) Filed: Nov. 29, 2017

(65) Prior Publication Data
US 2018/0097094 A1    Apr. 5, 2018

Related U.S. Application Data

(63) Continuation of application No. PCT/JP2016/086285, filed on Dec. 6, 2016.

(51) Int. Cl.
*H01L 29/66* (2006.01)
*H01L 29/739* (2006.01)
(Continued)

(52) U.S. Cl.
CPC ...... *H01L 29/7397* (2013.01); *H01L 29/0696* (2013.01); *H01L 29/0804* (2013.01);
(Continued)

(58) Field of Classification Search
CPC ............. H01L 29/7397; H01L 29/1004; H01L 29/0804; H01L 29/407; H01L 29/0696;
(Continued)

(56) References Cited

U.S. PATENT DOCUMENTS

2002/0179976 A1    12/2002    Takahashi
2003/0141542 A1    7/2003    Ishimura et al.
(Continued)

FOREIGN PATENT DOCUMENTS

CN    102403315 A    4/2012
JP    2002-353456 A    12/2002
(Continued)

OTHER PUBLICATIONS

International Search Report for International Patent Application No. PCT/JP2016/086285, issued by the Japan Patent Office dated Feb. 14, 2017.
(Continued)

*Primary Examiner* — Ismail A Muse

(57) ABSTRACT

At a portion at which a gate trench is branched, the trench is formed at a deeper position than at portions of the gate trench having a linear shape. A semiconductor device is provided, including: a first conductivity-type semiconductor substrate; a second conductivity-type base region provided at a front surface side of the semiconductor substrate; a first trench portion provided extending from a front surface of the semiconductor substrate and penetrating the base region; and a second conductivity-type contact region which is provided in a part of the base region at a front surface side of the semiconductor substrate and has a higher impurity concentration than the base region, wherein the first trench portion has a branch portion on the front surface of the semiconductor substrate, and the branch portion is provided being surrounded by the contact region on the front surface of the semiconductor substrate.

13 Claims, 16 Drawing Sheets

(51) Int. Cl.
  *H01L 29/06* (2006.01)
  *H01L 29/40* (2006.01)
  *H01L 29/08* (2006.01)
  *H01L 29/10* (2006.01)
  *H01L 29/36* (2006.01)
  *H01L 29/417* (2006.01)
  *H01L 29/423* (2006.01)

(52) U.S. Cl.
  CPC .......... *H01L 29/1004* (2013.01); *H01L 29/36* (2013.01); *H01L 29/407* (2013.01); *H01L 29/41708* (2013.01); *H01L 29/4236* (2013.01); *H01L 29/66348* (2013.01); *H01L 29/063* (2013.01); *H01L 29/0619* (2013.01); *H01L 29/402* (2013.01)

(58) Field of Classification Search
  CPC ............. H01L 29/1095; H01L 29/4236; H01L 29/41708
  See application file for complete search history.

(56) References Cited

U.S. PATENT DOCUMENTS

| | | | |
|---|---|---|---|
| 2004/0041171 A1* | 3/2004 | Ogura | H01L 29/0692 257/197 |
| 2005/0151187 A1 | 7/2005 | Wakimoto et al. | |
| 2007/0040213 A1* | 2/2007 | Hotta | H01L 29/0696 257/330 |
| 2008/0067542 A1 | 3/2008 | Tanaka et al. | |
| 2012/0056262 A1 | 3/2012 | Saito | |
| 2013/0037853 A1* | 2/2013 | Onozawa | H01L 29/0661 257/139 |
| 2014/0048847 A1* | 2/2014 | Yamashita | H01L 29/407 257/140 |
| 2014/0054645 A1 | 2/2014 | Saito et al. | |
| 2015/0206960 A1* | 7/2015 | Hirabayashi | H01L 27/0727 257/140 |
| 2015/0243771 A1 | 8/2015 | Kamata | |
| 2016/0111529 A1* | 4/2016 | Hirabayashi | H01L 29/7397 257/139 |
| 2016/0133742 A1* | 5/2016 | Okuda | H01L 29/7813 257/330 |
| 2016/0268181 A1* | 9/2016 | Yasuhara | H01L 29/51 |
| 2016/0336393 A1* | 11/2016 | Kim | H01L 29/0619 |
| 2017/0069729 A1 | 3/2017 | Nishiwaki | |
| 2017/0250179 A1* | 8/2017 | Senoo | H01L 27/0664 |

FOREIGN PATENT DOCUMENTS

| | | |
|---|---|---|
| JP | 2003-224278 A | 8/2003 |
| JP | 2005-175425 A | 6/2005 |
| JP | 2006-032676 A | 2/2006 |
| JP | 2007-221012 A | 8/2007 |
| JP | 2011-165971 A | 8/2011 |
| JP | 2012-059841 A | 3/2012 |
| JP | 2012-190938 A | 10/2012 |
| JP | 2013-120809 A | 6/2013 |
| JP | 2015-162610 A | 9/2015 |
| WO | 2015/182233 A1 | 12/2015 |

OTHER PUBLICATIONS

Notice of First Office Action for Patent Application No. 201680032134.9, issued by The State Intellectual Property Office of the People's Republic of China dated May 29, 2020.

* cited by examiner

INSULATED-GATE BIPOLAR TRANSISTOR (IGBT) INCLUDING A BRANCHED GATE TRENCH

The contents of the following Japanese patent applications are incorporated herein by reference:
NO. 2015-242474 filed in JP on Dec. 11, 2015,
NO. 2016-158920 filed in JP on Aug. 12, 2016, and
NO. PCT/JP2016/086285 filed on Dec. 6, 2016.

BACKGROUND

1. Technical Field

The present invention relates to a semiconductor device.

2. Related Art

Conventionally, semiconductor devices such as an IGBT having a structure including a branched gate trench are known (see Patent Document 1, for example).

Patent Document 1: Japanese Patent Application Publication No. 2012-190938

At a portion at which the gate trench is branched, the trench is formed at a deeper position than at portions of the gate trench having a linear shape.

SUMMARY

In one aspect of the present invention, a semiconductor device including a first conductivity-type substrate is provided. A second conductivity-type base region may be provided at a front surface side of the semiconductor substrate. A first trench portion provided extending from a front surface side of the semiconductor substrate and penetrating the base region may be provided in the semiconductor substrate. A second conductivity-type contact region which is provided in a part of the base region at a front surface side of the semiconductor substrate and has a higher impurity concentration than the base region may be provided in the semiconductor substrate. The first trench portion may include a branch portion on the front surface of the semiconductor substrate. The branch portion may be provided being surrounded by the contact region on the front surface of the semiconductor substrate.

The first trench portion may be formed surrounding each of one or more operating regions on the front surface of the semiconductor substrate. The semiconductor device may further include a second trench portion which is formed in the operating regions on the front surface of the semiconductor substrate and is separated from the first trench portion. The first trench portion may be a gate trench portion connected to a gate metal layer, and the second trench portion may be a dummy trench portion connected to an emitter electrode.

A first conductivity-type emitter region may be formed in the operating regions in which the dummy trench portion is formed. The semiconductor device may further include an interlayer insulating film formed above the front surface of the semiconductor substrate. The interlayer insulating film may include a contact hole which is positioned facing the operating regions and exposes at least a portion of the emitter region and the contact region.

The gate trench portion may be formed surrounding each of one or more extraction regions on the front surface of the semiconductor substrate. The emitter region may not be formed in each of the extraction regions. The extraction regions may be arranged adjacent to the operating regions with the gate trench portion intervening therebetween. Two of the extraction regions may be arranged at both sides of each of the operating regions.

On the front surface of the semiconductor substrate, a distance from the branch portion to the emitter region may be greater than a distance from the branch portion to the contact region. The gate trench portion may include a protruding portion which protrudes toward the dummy trench portion.

The gate trench portion may include an insulating film formed on an inner wall of a gate trench provided extending from the front surface of the semiconductor substrate and penetrating the base region. The gate trench portion may include a gate conductive portion formed inside the gate trench with its inner wall covered by the insulating film. The gate trench portion may include a bottom-side conductive portion which is formed inside the gate trench with its inner wall covered by the insulating film and at a position closer to a bottom portion of the gate trench than the gate conductive portion and is insulated from the gate conductive portion.

The dummy trench portion may include an insulating film formed on an inner wall of a dummy trench provided extending from the front surface of the semiconductor substrate and penetrating the base region. The dummy trench portion may include a dummy conductive portion formed inside the dummy trench with its inner wall covered by the insulating film. The bottom-side conductive portion may be connected to the dummy conductive portion inside the semiconductor substrate.

The bottom-side conductive portion may include a protruding region which protrudes downward at the branch portion. The first trench portion may include an insulating film formed on an inner wall of a trench provided extending from the front surface of the semiconductor substrate and penetrating the base region. A thickness of the insulating film at a bottom portion of the branch portion of the first trench portion may be greater than a thickness of the insulating film at a bottom portion of a part of the first trench portion other than the branch portion.

The semiconductor device may further include an accumulation region formed below the base region in the semiconductor substrate. The first trench portion may be provided penetrating the accumulation region. A peripheral region may be provided in the accumulation region and surrounding the branch portion, wherein at the peripheral region, a thickness of the accumulation region in a depth direction at a position contacting the first trench portion is smaller than a thickness of the accumulation region at a position farthest from adjacent first trench portions in a horizontal direction.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1A:
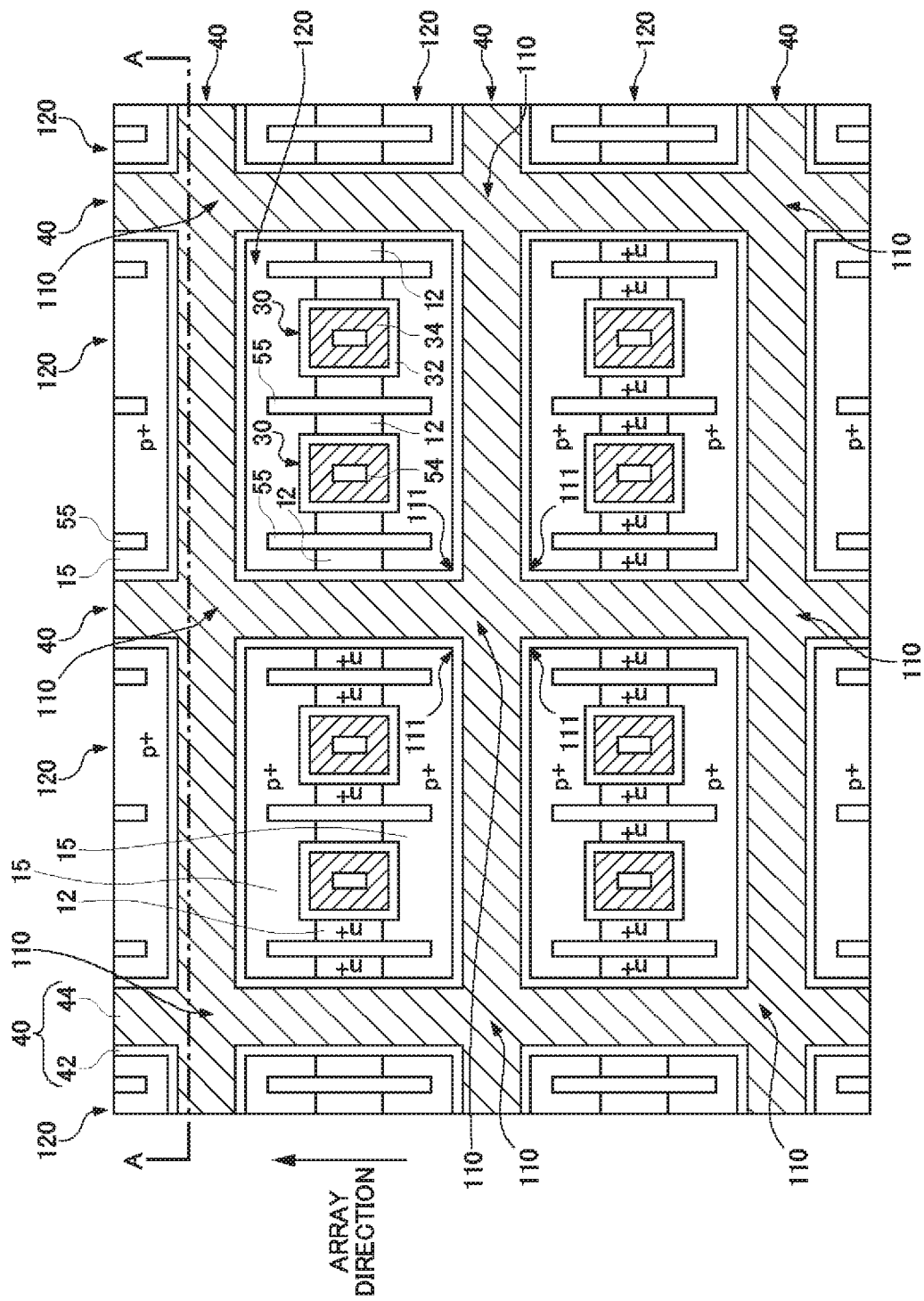
FIG. 1A shows an exemplary configuration of a semiconductor device 100 according to an embodiment of the present invention.
Figure 1B:
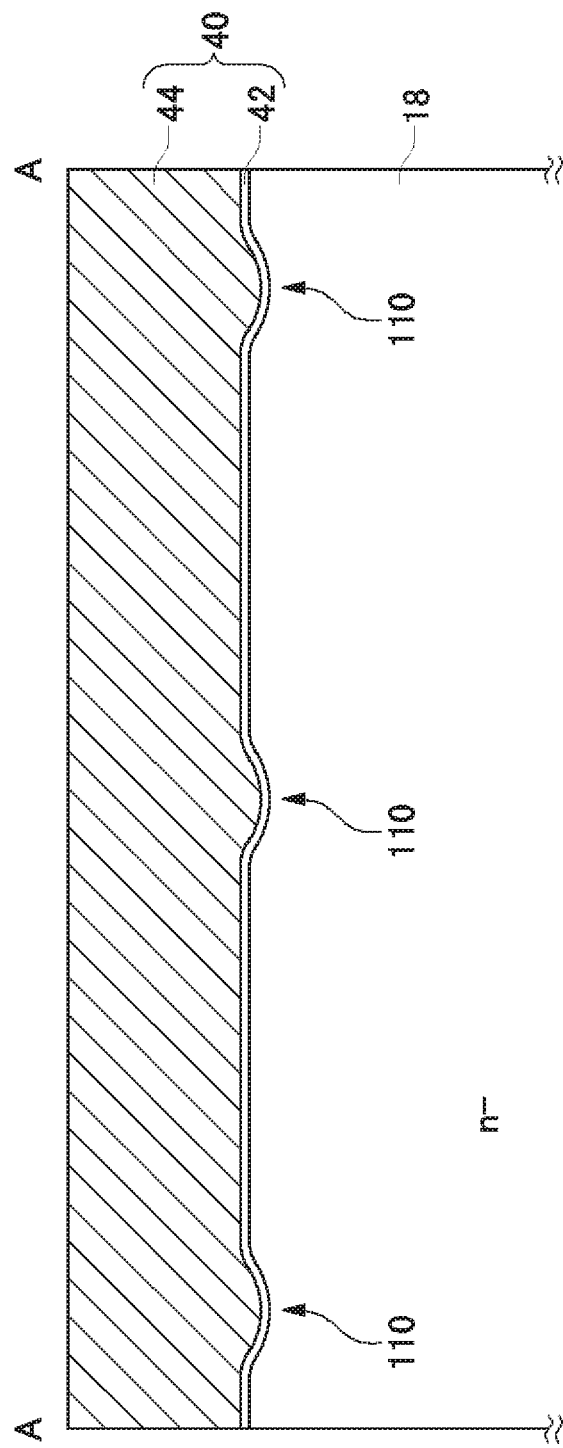
FIG. 1B shows a cross section taken along A-A in FIG. 1A.

FIG. 1A shows an exemplary configuration of a semiconductor device 100 according to an embodiment of the present invention. FIG. 1B shows a cross section taken along A-A in FIG. 1A. The semiconductor device 100 is a semiconductor chip having semiconductor elements such as an IGBT (Insulated Gate Bipolar Transistor) and an FWD (Free Wheel Diode). FIG. 1A schematically shows a part of an active region which is in the front surface of the semiconductor device 100 and in which the semiconductor elements are formed. The structure shown in FIG. 1A is repeatedly formed on the front surface of the semiconductor device 100.

The semiconductor device 100 may have an edge termination structure surrounding the active region. The active region refers to a region in which current flows when the semiconductor device 100 is controlled to be in an ON state. The edge termination structure mitigates electric field concentration at the front surface side of the semiconductor substrate. The edge termination structure has, for example, a guard ring, a field plate, a RESURF or any combination thereof.

The semiconductor device 100 in the present example includes, at the front surface side of the chip, a gate trench portion 40, a dummy trench portion 30, an emitter region 12, a contact region 15, a contact hole 54 and a contact hole 55. The gate trench portion 40 is one example of a first trench portion, and the dummy trench portion 30 is one example of a second trench portion.

The gate trench portion 40, the dummy trench portion 30, the emitter region 12 and the contact region 15 are formed inside the semiconductor substrate at the front surface side of the semiconductor substrate. In the present example, the semiconductor substrate is of a first conductivity type. The first conductivity type is n-type, as one example. A second conductivity-type base region is formed in the semiconductor substrate at its front surface side. Note that, in an area shown in FIG. 1A, the base region is not exposed on the front surface of the semiconductor substrate. The second conductivity type is p-type, as one example. Note that the conductivity types of a substrate, a region and another portion described in each example may each be reversed from those conductivity types.

The emitter region 12 is formed in parts of the base region, being exposed on the front surface of the semiconductor substrate. The emitter region 12 in the present example is of (n+)-type and has a higher impurity concentration than the semiconductor substrate. The contact region 15 is formed in parts of the base region, being exposed on the front surface of the semiconductor substrate. The contact region 15 in the present example is of (p+)-type and has a higher impurity concentration than the base region. The emitter region 12 and the contact region 15 are each formed to have a band-like shape on the front surface of the semiconductor substrate and are formed alternately in a predetermined array direction.

The gate trench portion 40 and the dummy trench portion 30 are provided extending from the front surface side of the semiconductor substrate and penetrating the base region. The gate trench portion 40 and the dummy trench portion 30 provided at regions in which the emitter region 12 or the contact region 15 is formed also penetrate the emitter region 12 or the contact region 15.

The gate trench portion 40 has an insulating film 42 formed on the inner wall of the gate trench and a gate conductive portion 44 formed inside the gate trench with its inner wall covered by the insulating film 42. The gate conductive portion 44 functions as a gate metal layer to control a channel. Also, the dummy trench portion 30 has an insulating film 32 formed on the inner wall of the dummy trench and a dummy conductive portion 34 formed inside the dummy trench with its inner wall covered by the insulating film 32. The gate conductive portion 44 and the dummy conductive portion 34 are formed of polysilicon, for example.

The gate trench portion 40 includes a branch portion 110 on the front surface of the semiconductor substrate. The branch portion 110 refers to a portion at which the gate trench portion 40 extends in at least three directions from one place on the front surface of the semiconductor substrate. For example, one example of the branch portion 110 includes a position at which two or more linear gate trench portions 40 intersect, and a position at which the gate trench portion 40 is branched from one gate trench portion 40.

The gate trench portion 40 in the present example includes a first portion which extends in a direction substantially perpendicular to the array direction of the emitter region 12 and the contact region 15. That is, the first portion of the gate trench portion 40 is formed to intersect both the emitter region 12 and the contact region 15. The gate trench portion 40 includes a plurality of first portions provided in parallel with each other. When a predetermined voltage is applied to the gate conductive portion 44 formed inside the gate trench portion 40, a channel is formed in a region contacting the gate trench portion 40 in the p-type base region formed below the emitter region 12. In this manner, current flows in a depth direction of the semiconductor substrate.

Also, the gate trench portion 40 in the present example includes a second portion which extends in a direction perpendicular to the array direction. That is, the second portion of the gate trench portion 40 extends in parallel with the emitter region 12 and the contact region 15. The gate trench portion 40 includes a plurality of second portions provided in parallel with each other. The second portion of the gate trench portion 40 may be formed in a region sandwiched by two contact regions 15. On the front surface of the semiconductor substrate in the present example, the contact region 15, the emitter region 12, the contact region 15 and the gate trench portion 40 are repeatedly formed in this order in the array direction.

In this way, as the gate trench portion 40 has the branch portion 110, the density of the gate trench portion 40 on the front surface of the semiconductor substrate can be easily adjusted. That is, by adjusting the cycle of branches of the gate trench portion 40, the area occupied by the gate trench portion 40 can be easily adjusted. Also, since the dummy trench portion 30 is arranged in a dotted manner in regions surrounded by the gate trench portion 40, the density of the dummy trench portion 30 can be easily adjusted. That is, by adjusting the number of dummy trench portions 30, the area occupied by the dummy trench portion 30 can be easily adjusted. It is therefore possible to easily adjust the gate capacitance to be a desired value.

In the present example, the first portion and the second portion of the gate trench portion 40 are formed to intersect each other. That is, the intersecting portion of the first portion and the second portion corresponds to the branch portion 110. The gate trench portion 40 includes a gate trench which is formed by etching from the front surface side of the semiconductor substrate.

Here, as shown in FIG. 1B, a portion of the gate trench corresponding to the branch portion 110 is more likely to allow etchant to infiltrate into the trench so that the gate trench is formed at a deep position, compared to portions of the gate trench other than the branch portion 110. Note that an (n−)-type drift region 18 is formed below the gate trench. On the other hand, if the gate trench is formed at a deep position, electric fields are likely to concentrate at an end of the gate trench portion 40 formed at a deep position, and the avalanche breakdown is likely to occur at the end portion.

Also, if the trench depth of the gate trench portion 40 is varied, the depth position at which the gate conductive portion 44 is formed is also varied. Therefore, the depth direction length of a region in which the gate conductive portion 44 and the base region face each other might change. In this case, the channel length would change, and the threshold voltage of the semiconductor elements would be varied.

The branch portion 110 in the present example is formed being surrounded by the (p+)-type contact region 15 on the front surface of the semiconductor substrate. The gate trench portion 40 extends in three or more extending directions from the branch portion 110. Reference to the branch portion 110 being surrounded by the contact region 15 means that the contact region 15 is adjacent to at least each vertex 111 of the branch portion 110. It is preferable that the contact region 15 is also formed in a region within a predetermined distance from each vertex 111. The predetermined distance may be, for example, 1/10 or a half of the width of the gate trench portion 40, or may be equal to the width.

Note that, in the case of a shape such as a T-shape in which the gate trench portion 40 is branched from one sidewall of the gate trench portion 40 having a predetermined shape such as a linear shape and the gate trench portion 40 is not branched from the other sidewall, the contact region 15 is also formed adjacent to the side of the branch portion 110 from which the gate trench portion 40 is not branched. It is preferable that the contact region 15 is formed across at least an area facing portions of the gate trench portion 40 being branched. It is also preferable that the contact region 15 is formed in a region within the predetermined distance described above from an end portion of the gate trench portion facing portions of the gate trench portion 40 being branched.

As the branch portion 110 is surrounded by the (p+)-type contact region 15 having a high concentration, the breakdown voltage of a portion at which electric fields are likely to concentrate can be increased compared to the case where the branch portion 110 is surrounded by the p-type base region having a low concentration. It is also possible to allow the avalanche current generated at the bottom portion of the branch portion 110 to flow from the (p+)-type contact region 15 having a high concentration formed around the branch portion 110 to an emitter electrode. In this manner, the avalanche current does not flow toward the (n+)-type emitter region 12, and therefore the latch-up can be suppressed. Also, since the emitter region 12 is not formed around the branch portion 110, a channel is not formed around the branch portion 110. Therefore, even if the depth position of the gate conductive portion 44 provided inside the gate trench portion 40 is varied at the branch portion 110, variation in the threshold voltage of the semiconductor elements can be reduced.

Also, the gate trench portion 40 in the present example is formed surrounding one or more operating regions 120 on the front surface of the semiconductor substrate. In each operating region 120, the emitter region 12 is exposed on the front surface of the semiconductor substrate. Also, in each operating region 120, a channel is formed at a part of the base region positioned below a portion of the emitter region 12 adjacent to the gate trench portion 40.

In each operating region 120, the emitter region 12 is arranged being sandwiched by two contact regions 15. Note that an interlayer insulating film and an emitter electrode are formed above the region of the front surface of the semiconductor substrate shown in FIG. 1A. The interlayer insulating film is formed to cover the front surface of the semiconductor substrate. A contact hole 55 is formed in a partial region of the interlayer insulating film facing the emitter region 12 and the two contact regions 15. Each contact hole 55 is formed extending in the array direction from one of the contact regions 15 to the other of the contact regions 15 and passing through the emitter region 12.

One or more contact holes 55 may be formed in each operating region 120. For example, in a direction perpendicular to the array direction, the contact hole 55 is formed between the gate trench portion 40 and each dummy trench portion 30, and between adjacent two dummy trench portions 30.

Also, one or more dummy trench portions 30 are formed in at least one operating region 120. In the present example, a plurality of dummy trench portions 30 are formed in each operating region 120. The dummy trench portion 30 is separated from the gate trench portion 40. The word "separated" means that the dummy conductive portion 34 and the gate conductive portion 44 are electrically insulated from each other. In the present example, the dummy trench portion 30 is formed apart from the gate trench portion 40 on the front surface of the semiconductor substrate.

Each dummy trench portion 30 in the present example is formed extending from one of the contact regions 15 to the other of the contact regions 15 and passing through the emitter region 12, in each operating region 120. The contact region 15 may be formed between each dummy trench portion 30 and the gate trench portion 40 in the array direction. In another example, only the insulating film may be formed on the front surface of the semiconductor substrate between each dummy trench portion 30 and the gate trench portion 40 in the array direction.

In this case, the contact region 15 and the emitter region 12 are divided by the dummy trench portion 30 inside the operating regions 120. The contact hole 55 is provided at each region divided by the dummy trench portion 30. Also, the dummy conductive portion 34 formed inside the dummy trench portion 30 is electrically connected to the emitter electrode via the contact hole 54.

Note that the gate conductive portion 44 in the gate trench portion 40 is electrically connected to the gate metal layer. The gate trench portion 40 may be formed extending to a region that is not covered by the emitter electrode and connected to the gate metal layer at the region.

Note that the dummy trench portion 30 may be provided such that the distance between each dummy trench portion 30 and the gate trench portion 40 is equal in each direction. The distance between dummy trench portions 30 and the distance between each dummy trench portion 30 and the gate trench portion 40 may also be equal.

Figure 2:
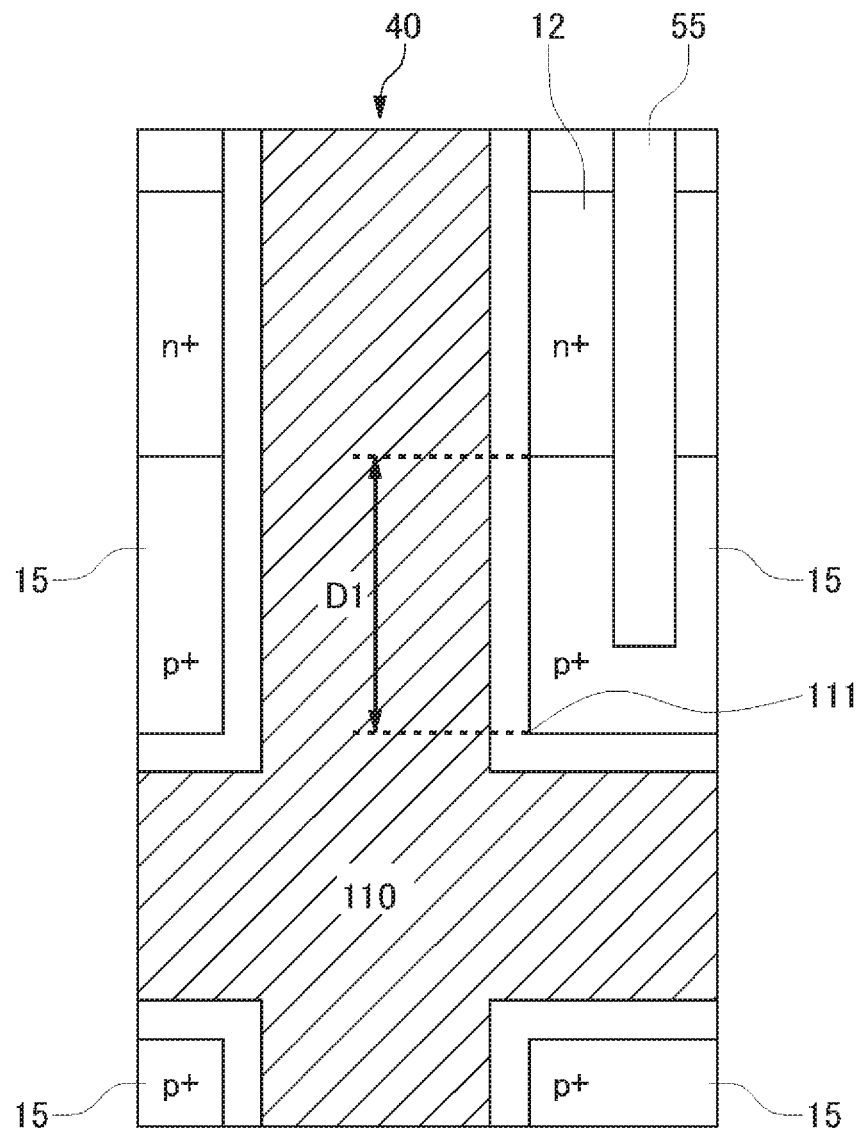
FIG. 2 is an enlarged view of a region around a branch portion 110.

FIG. 2 is an enlarged view of a region around a branch portion 110. As described above, the branch portion 110 is arranged being surrounded by the contact region 15. Therefore, on the front surface of the semiconductor substrate, the distance D1 from the branch portion 110 to the emitter region 12 is greater than the distance from the branch portion 110 to the contact region 15. With such a configuration, even if the depth of the gate trench portion 40 is varied at the branch portion 110, its influence on the threshold voltage of the semiconductor elements can be reduced.

Note that the distance D1 from the branch portion 110 to the emitter region 12 may refer to the shortest distance from the vertex 111 of the branch portion 110 to the emitter region 12. Similarly, the distance from the branch portion 110 to the contact region 15 refers to the shortest distance from the vertex 111 to the contact region 15. This distance is zero because the contact region 15 is formed contacting the vertex 111.

Also, since a channel is formed in the base region below the emitter region 12, holes which flow from the back surface side of the semiconductor substrate when turning off are attracted to electrons of the channel. On the other hand, holes flowing from the back surface side of the semiconductor substrate are relatively likely to concentrate at a region around the branch portion 110. Accordingly, if the branch portion 110 and the emitter region 12 are arranged close to each other, holes around the branch portion 110 are attracted toward the emitter region 12, making it impossible to extract the holes efficiently. In the present example, since the emitter region 12 is formed apart from the branch portion 110, attraction of holes toward the emitter region 12 can be suppressed.

Figure 3:
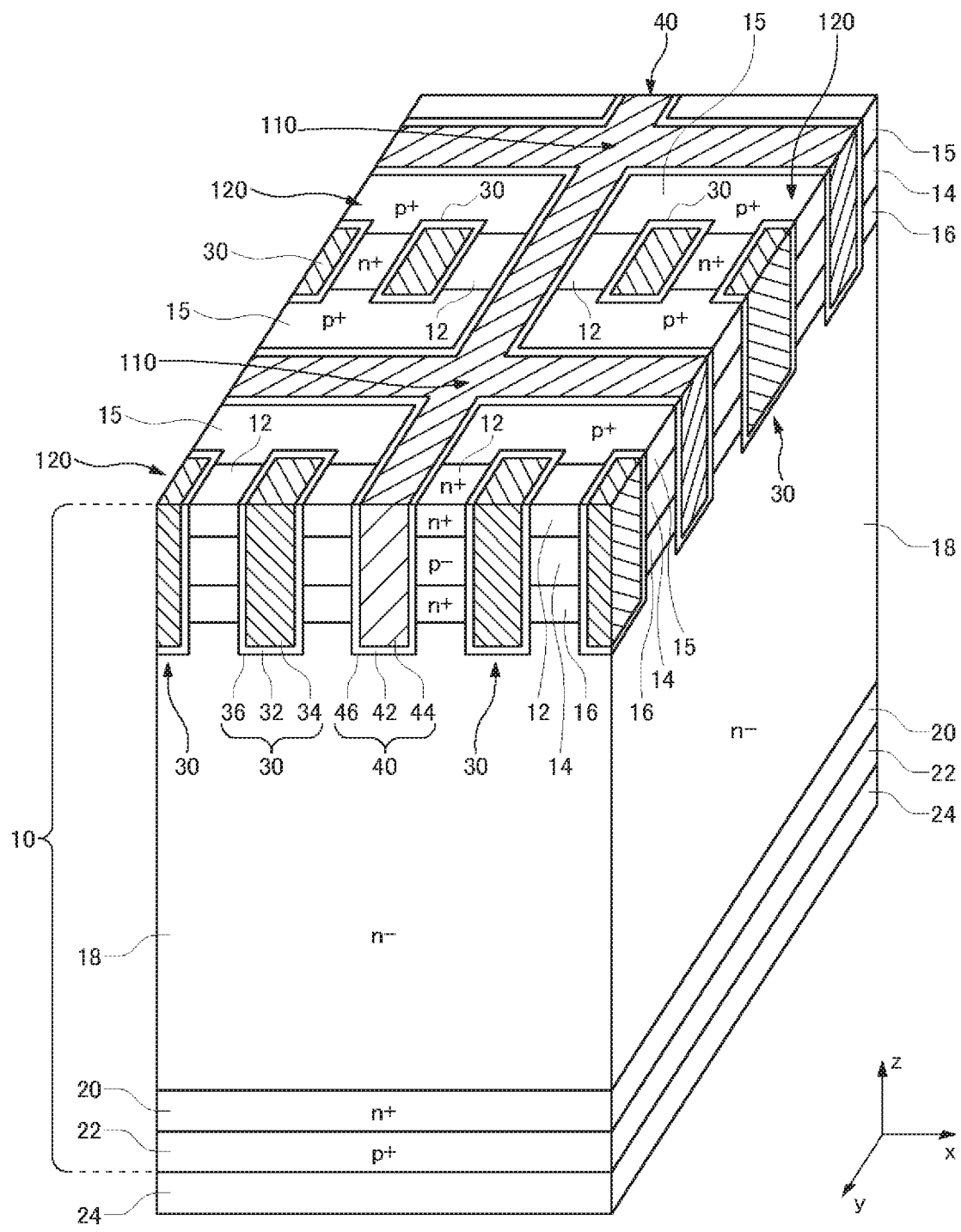
FIG. 3 is a perspective cross-sectional view of the semiconductor device 100.

FIG. 3 is a perspective cross-sectional view of the semiconductor device 100. FIG. 3 shows a semiconductor substrate 10 and a collector electrode 24. In the present example, the array direction of the emitter region 12 and the contact region 15 is defined as a y-direction, a direction orthogonal to the y-direction on the front surface of the semiconductor substrate 10 is defined as an x-direction, and the depth direction of the semiconductor substrate 10 is defined as a z-direction. The depth direction of the semiconductor substrate 10 refers to a direction perpendicular to the front surface and back surface of the semiconductor substrate 10. FIG. 3 shows an x-z cross section passing through the emitter region 12 and a y-z cross section passing through the dummy trench portion 30. Note that the front surface of the semiconductor substrate 10 is in an x-y plane.

The semiconductor substrate 10 may be a silicon substrate, or may be a silicon carbide substrate, a nitride semiconductor substrate, or the like. A (p−)-type base region 14 is formed in the semiconductor substrate 10 at its front surface side. As as shown in the x-z cross section, an (n+)-type emitter region 12 is selectively formed in partial regions of the base region 14 at its front surface side. Also, as shown in the y-z cross section, a (p+)-type contact region 15 is selectively formed in partial regions of the base region 14 at its front surface side.

The semiconductor substrate 10 further includes an (n+)-type accumulation region 16, an (n−)-type drift region 18, an (n+)-type buffer region 20, a (p+)-type collector region 22. The accumulation region 16 is formed at the back surface side of the base region 14. The impurity concentration of the accumulation region 16 is higher than the impurity concentration of the drift region 18.

The accumulation region 16 is formed between adjacent trenches. The accumulation region 16 is formed between each dummy trench portion 30 and the gate trench portion 40 and between adjacent dummy trench portions 30. The dummy trench portion 30 has a dummy trench 36, and the gate trench portion 40 has a gate trench 46. The accumulation region 16 may be provided to cover the entire region between trench portions. By providing the accumulation region 16, the IE effect can be increased, reducing the ON voltage.

The drift region 18 is formed at the back surface side of the accumulation region 16. The buffer region 20 is formed at the back surface side of the drift region 18. The impurity concentration of the buffer region 20 is higher than the impurity concentration of the drift region 18. The buffer region 20 may function as a field stop layer to prevent a depletion layer expanding from the back surface side of the base region 14 from reaching the collector region 22. The collector region 22 is formed at the back surface side of the buffer region 20. Also, the collector electrode 24 is provided on the back surface of the collector region 22.

Note that the cross-sectional structure of the semiconductor substrate 10 around the branch portion 110 is similar to the structure in the y-z cross section. That is, at a region around the branch portion 110, the contact region 15, the base region 14, the accumulation region 16, the drift region 18, the buffer region 20 and the collector region 22 are formed from the front surface side of the semiconductor substrate 10. That is, a channel is not formed around the branch portion 110. Therefore, even if the gate trench portion 40 at the branch portion 110 is formed at a deep position, its influence on the threshold voltage of the semiconductor elements is small.

Figure 4:
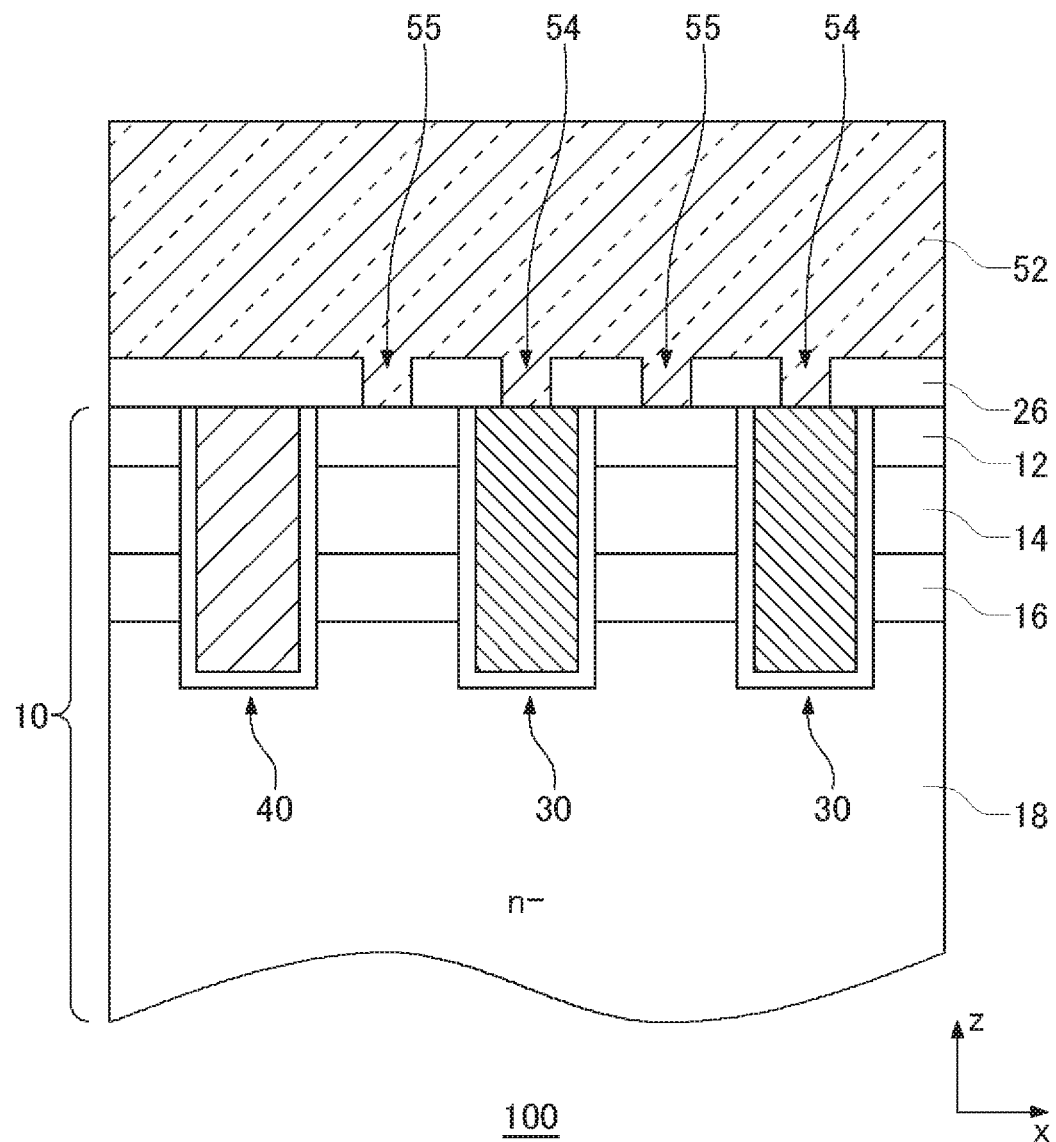
FIG. 4 shows one example of an x-z cross section of the semiconductor device 100.

FIG. 4 shows one example of an x-z cross section of the semiconductor device 100. FIG. 4 shows an x-z cross section passing through the emitter region 12. The x-z cross section of the semiconductor substrate 10 is the same as the x-z cross section shown in FIG. 3. An interlayer insulating film 26 and an emitter electrode 52 are formed above the front surface of the semiconductor substrate 10.

The interlayer insulating film 26 is formed to cover the front surface of the semiconductor substrate 10. The emitter electrode 52 is formed above the interlayer insulating film 26. Contact holes are formed in parts of the interlayer insulating film 26 at positions facing the operating regions 120. Specifically, the contact hole 55 is formed at a region facing the emitter region 12, and the contact hole 54 is formed at a region facing the dummy trench portion 30. The emitter electrode 52 is also formed inside the contact hole 54 and the contact hole 55, and is electrically connected to the dummy conductive portion 34 and the emitter region 12. The emitter electrode 52 may be formed of an aluminium-containing metal.

Also, parts of the emitter electrode 52 inside the contact hole 54 and the contact hole 55 may be formed of a tungsten-containing metal. By forming a part of the emitter electrode 52 of a tungsten-containing metal, even if the contact hole 54 and the contact hole 55 are miniaturized, the reliability for electrical connection between the emitter electrode 52 and either of the emitter region 12 and the dummy conductive portion 34 can be increased.

Note that, at regions other than the branch portion 110, the gate trench portion 40 and the dummy trench portion 30 may be formed at the same depth. In this case, the gate trench portion 40 and the dummy trench portion 30 are formed to have the same width. Also, one of the gate trench portion 40 and the dummy trench portion 30 may be formed at a deeper position than the other. In this case, the width of the trench portion formed at a deeper position is smaller than the width of the trench portion formed at a shallower position.

Figure 5:
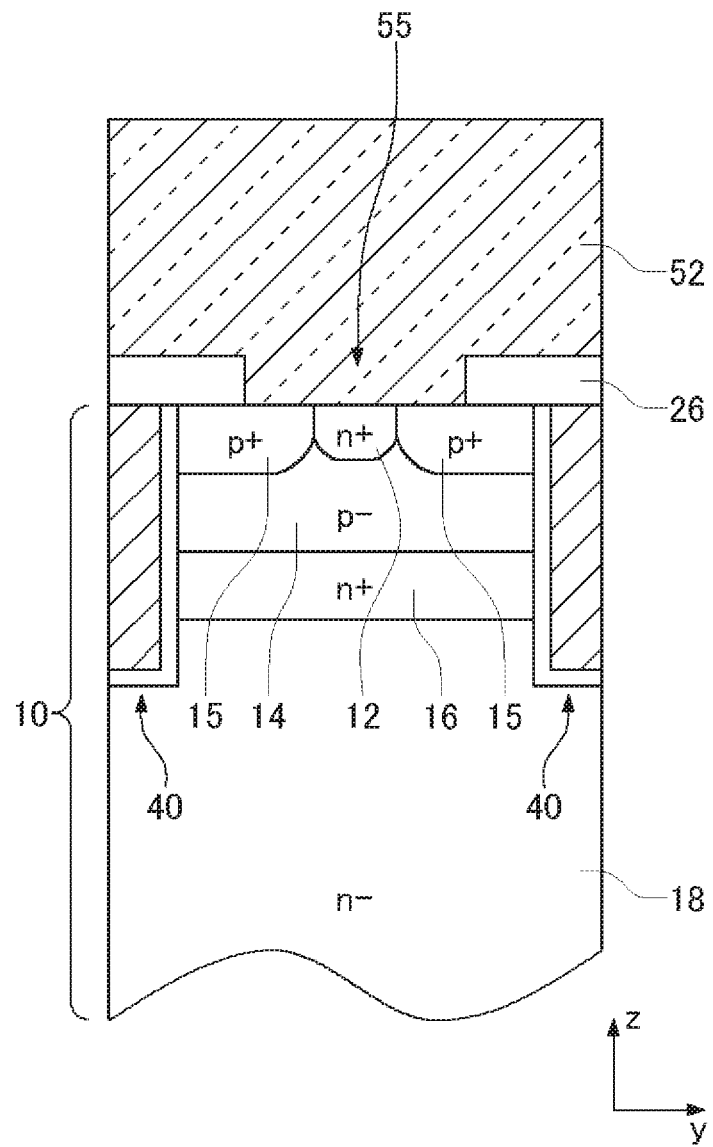
FIG. 5 shows one example of a y-z cross section of the semiconductor device 100.

FIG. 5 shows one example of a y-z cross section of the semiconductor device 100. FIG. 5 shows a y-z cross section passing through the contact hole 55. In the cross section, a plurality of gate trench portions 40 are formed at the front surface side of the semiconductor substrate 10. A contact region 15, an emitter region 12 and a contact region 15 are exposed on the front surface of the semiconductor substrate 10 between two gate trench portions 40 in this order.

The front surface of the semiconductor substrate 10 is covered by the interlayer insulating film 26. The contact hole 55 exposes at least a portion of each region of the emitter region 12 and the contact region 15. The emitter electrode 52 is connected to the emitter region 12 and the contact region 15 through the contact hole 55.

Figure 6:
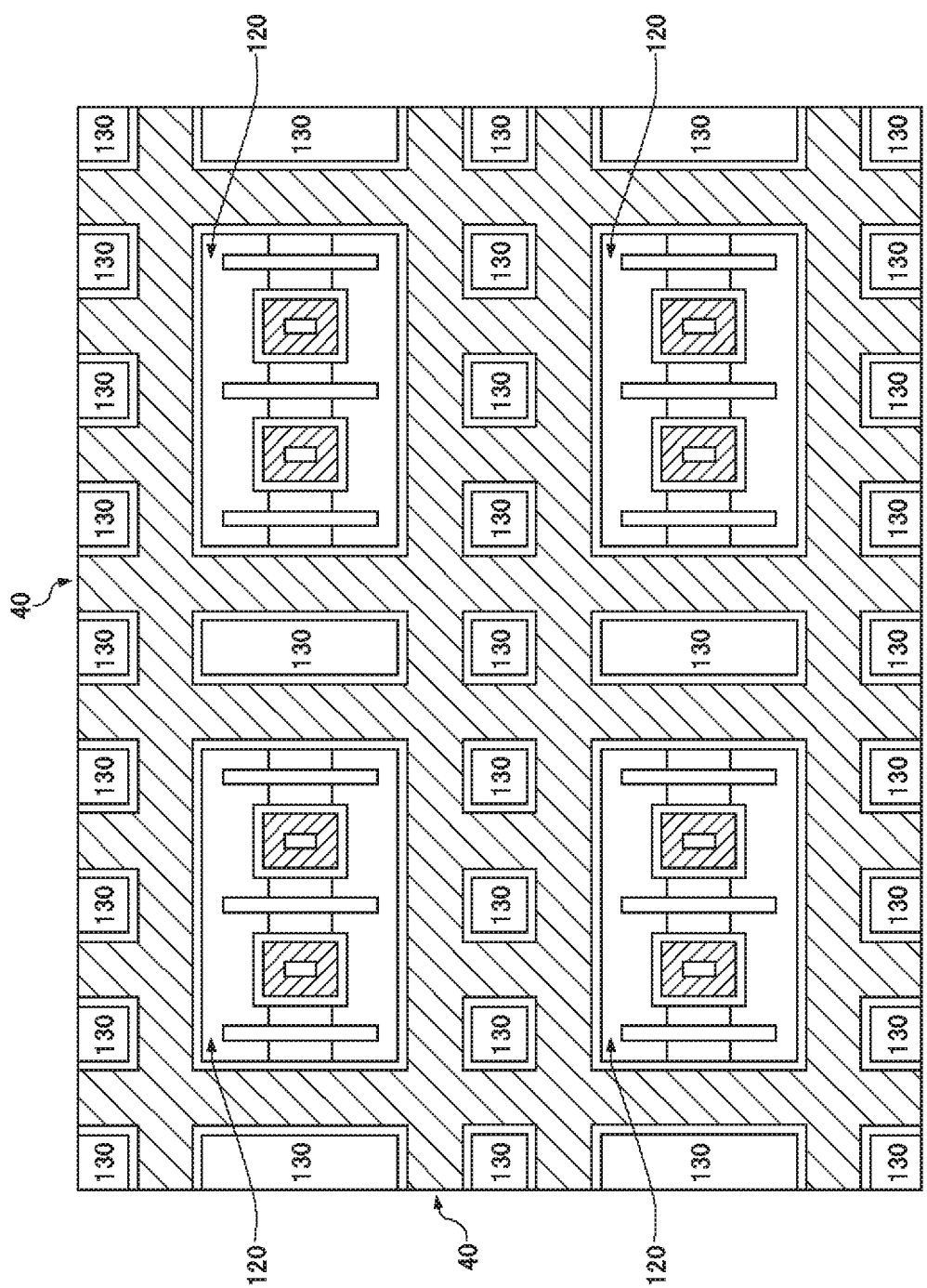
FIG. 6 shows another exemplary configuration of the semiconductor device 100.

FIG. 6 shows another exemplary configuration of the semiconductor device 100. The semiconductor device 100 in the present example further includes an extraction region 130 in the front surface of the semiconductor substrate 10 relative to the semiconductor device 100 described with reference to FIG. 1A to FIG. 5.

Figure 7:
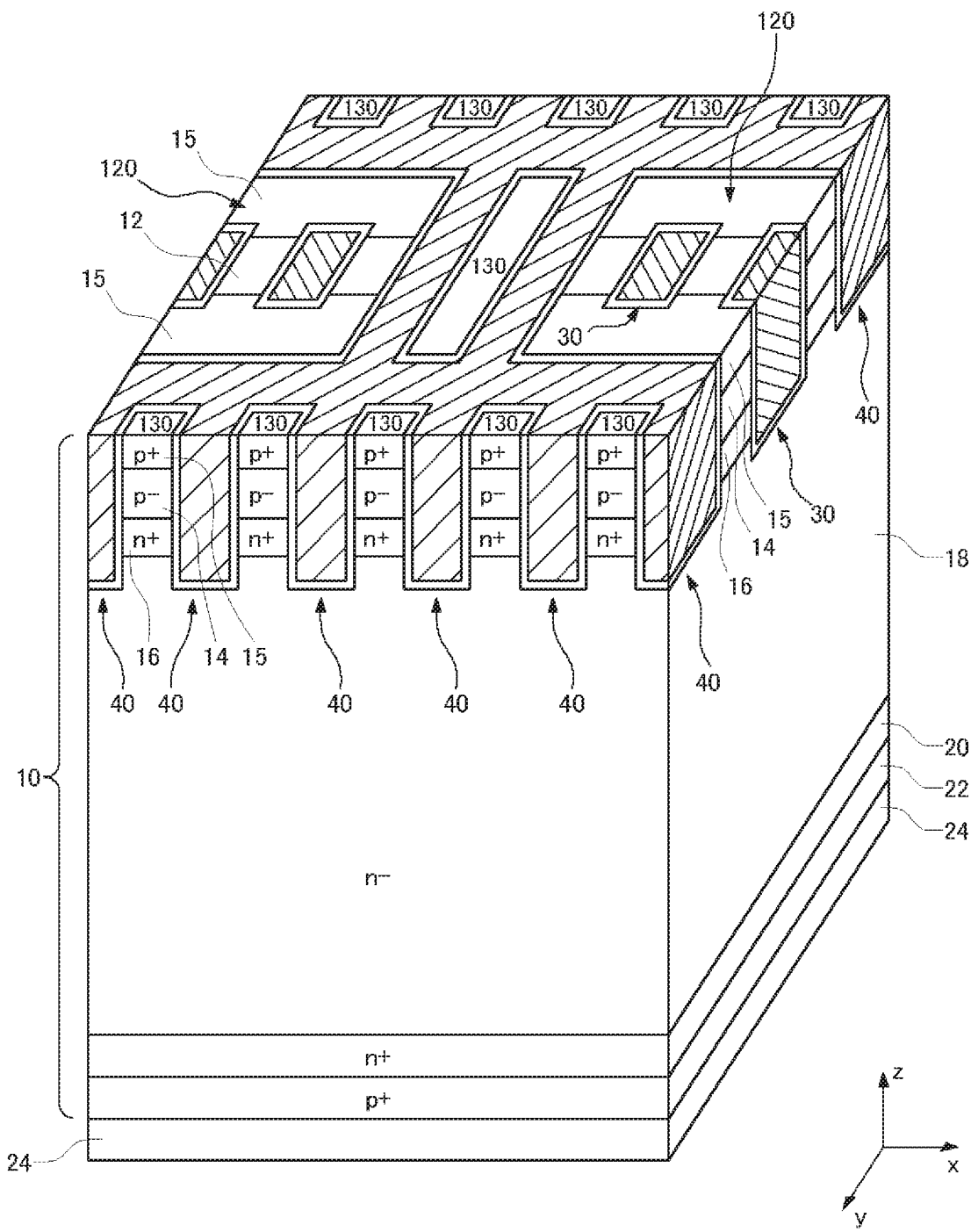
FIG. 7 is a perspective cross-sectional view of the semiconductor device 100 shown in FIG. 6.

FIG. 7 is a perspective cross-sectional view of the semiconductor device 100 shown in FIG. 6. The gate trench portion 40 is formed surrounding one or more extraction regions 130 on the front surface of the semiconductor substrate 10. Note that the emitter region 12 is not formed in each extraction region 130.

As shown in FIG. 7, in the present example, the contact region 15 is formed in the entire front surface of the extraction region 130. The extraction region 130 may be arranged at both sides of the operating region 120. Both sides of the operating region 120 refer to positions sandwiching the operating region 120. The semiconductor device 100 in the present example includes a plurality of extraction regions 130 surrounding each operating region 120. The extraction region 130 may be discretely arranged at regions surrounding the operating region 120.

Each extraction region 130 is arranged adjacent to the operating region 120 with the gate trench portion 40 intervening therebetween. That is, each extraction region 130 is arranged such that it can be connected to the gate trench portion 40 by a line passing through only a region on the gate trench portion 40.

By providing the extraction regions 130, holes which flow from the back surface side of the semiconductor substrate 10 when turning off can be extracted further efficiently. Each extraction region 130 may have the same shape and the same size, or may have a different shape and different size. The width of the gate trench portion 40 between extraction regions 130 may be the same as the width of the gate trench portion 40 around the operating region 120.

Figure 8:
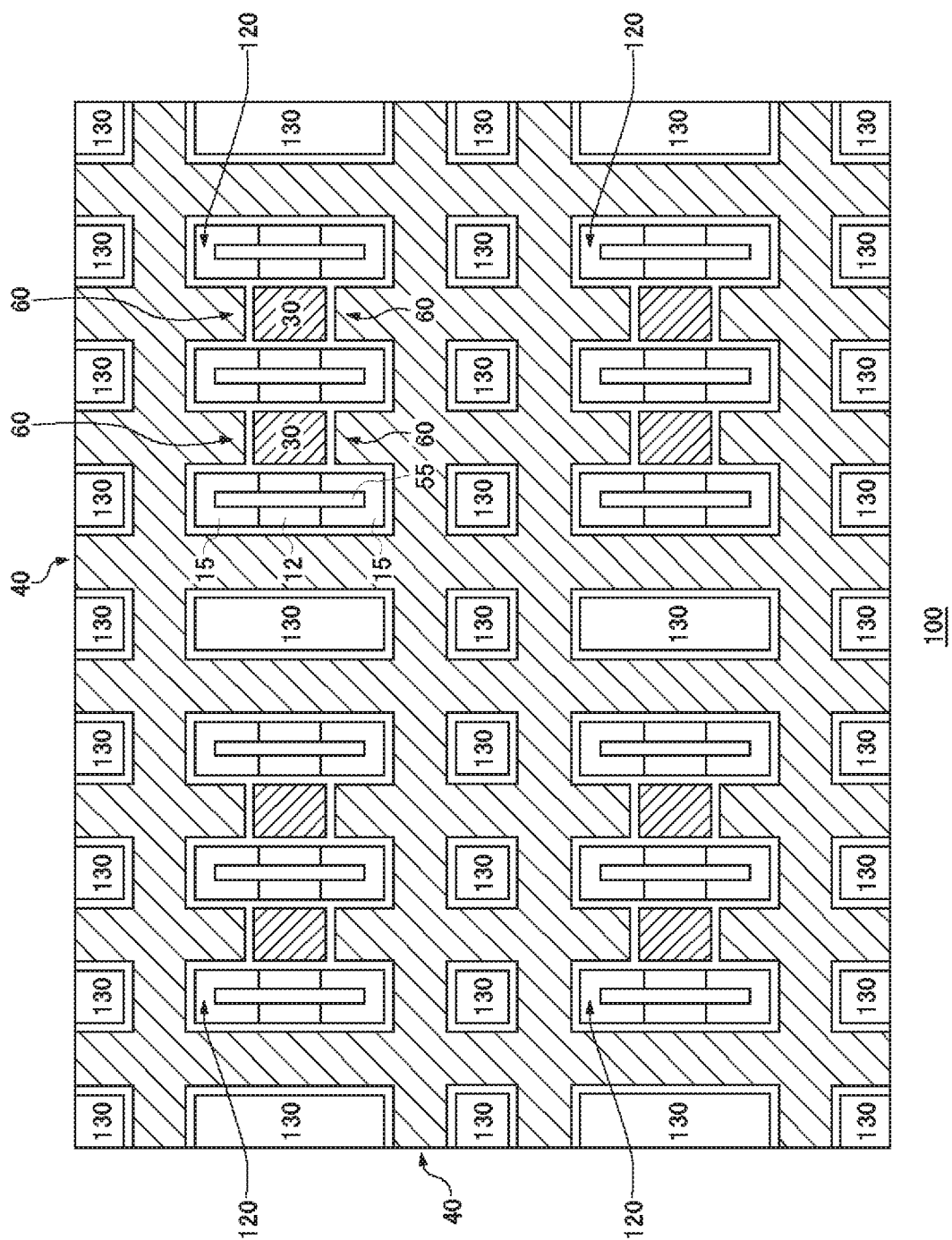
FIG. 8 shows another exemplary configuration of the semiconductor device 100.

FIG. 8 shows another exemplary configuration of the semiconductor device 100. The semiconductor device 100 in the present example includes a protruding portion 60 in the gate trench portion 40 relative to any of the semiconductor device 100 described with reference to FIG. 1A to FIG. 7. Although an example is shown in FIG. 8 in which a protruding portion 60 is further provided to the semiconductor device 100 having the extraction region 130 as shown in FIG. 6, the protruding portion 60 may be further provided also to the semiconductor device 100 having no extraction region 130 as shown in FIG. 1A.

The protruding portion 60 is formed protruding from a part of the gate trench portion 40 around an operating region 120 toward the dummy trench portion 30 provided inside the operating region 120. The protruding portion 60 in the present example is formed extending from portions of the gate trench portion 40 which are provided around the operating region 120 and extend in a direction perpendicular to the array direction of the contact region 15 and the emitter region 12 toward the dummy trench portion 30. The protruding portion 60 may be formed at both sides of the dummy trench portion 30. That is, the protruding portion 60 may be formed at each of two facing sides of the operating region 120.

The protruding portion 60 in the present example is formed to have the same width as the dummy trench portion 30. An insulating film as a gate insulating film 42 or a dummy insulating film 32 is formed between the protruding portion 60 and the dummy trench portion 30. In the present example, neither the contact region 15 nor the emitter region 12 is exposed on the front surface of the semiconductor substrate 10 between the protruding portion 60 and the dummy trench portion 30. In another example, the contact region 15 may be exposed on the front surface of the semiconductor substrate 10 between the protruding portion 60 and the dummy trench portion 30.

Such a configuration also makes it possible to suppress insulation breakdown at the branch portion 110. It is also possible to suppress variation in the threshold voltage of the semiconductor elements. It is also possible to extract holes efficiently when turning off.

Figure 9:
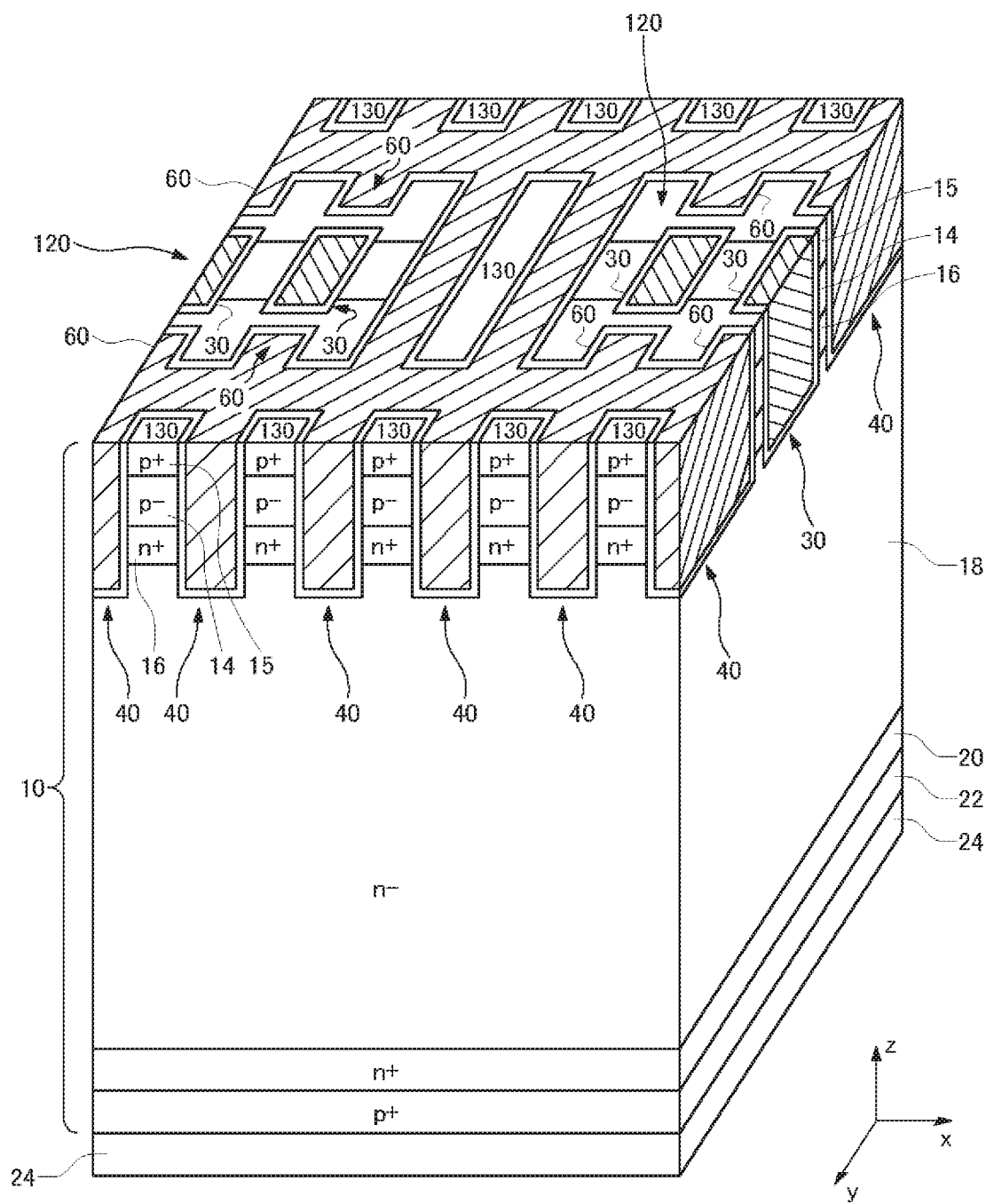
FIG. 9 is a perspective cross-sectional view of the semiconductor device 100 shown in FIG. 8.

FIG. 9 is a perspective cross-sectional view of the semiconductor device 100 shown in FIG. 8. In the present example, an example is shown in which a contact region 15, a base region 14 and an accumulation region 16 are provided between the protruding portion 60 and the dummy trench portion 30 in the array direction. As described above, an insulating film may be formed, instead of the contact region 15, the base region 14 and the accumulation region 16, between the protruding portion 60 and the dummy trench portion 30.

Figure 10:
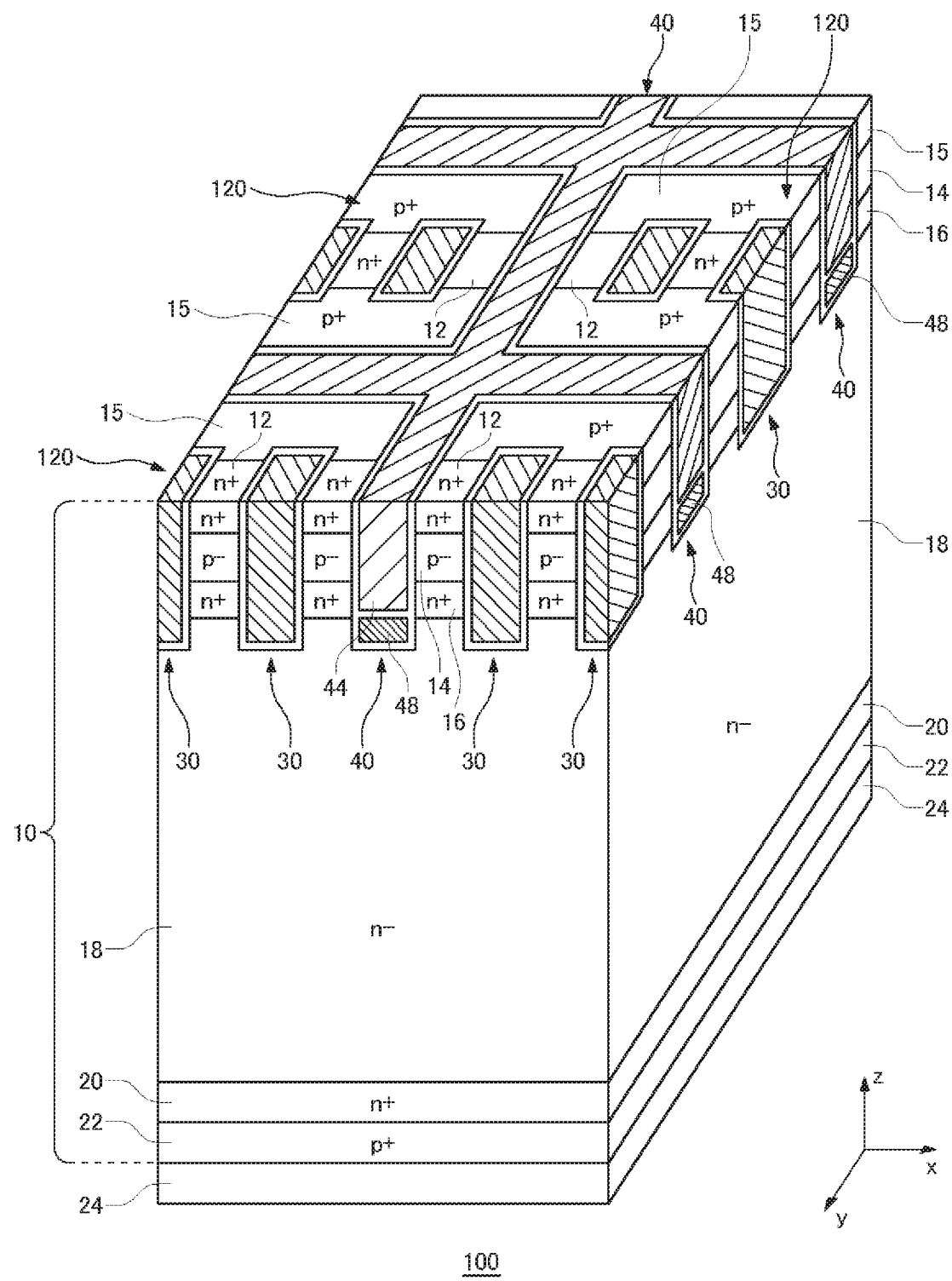
FIG. 10 is a perspective cross-sectional view showing another exemplary configuration of the semiconductor device 100.

FIG. 10 is a perspective cross-sectional view showing another exemplary configuration of the semiconductor device 100. The semiconductor device 100 in the present example further includes a bottom-side conductive portion 48 relative to any of the semiconductor device 100 shown in FIG. 1A to FIG. 9. Other configurations are the same as those of any of the semiconductor device 100 shown in FIG. 1A to FIG. 9. FIG. 10 shows a configuration in which a bottom-side conductive portion 48 is added to the semiconductor device 100 shown in FIG. 3. The bottom-side conductive portion 48 may be formed of the same material as the gate conductive portion 44 and the dummy conductive portion 34.

The bottom-side conductive portion 48 is provided inside the gate trench portion 40. More specifically, the bottom-side conductive portion 48 is formed inside a gate trench with its inner wall covered by an insulating film and at a position closer to the bottom portion of the gate trench than the gate conductive portion 44. The bottom-side conductive portion 48 is electrically insulated from the gate conductive portion 44. In the present example, an insulating film is formed between the bottom-side conductive portion 48 and the gate conductive portion 44.

The gate conductive portion 44 is formed across a region facing at least the base region 14 in the depth direction. The bottom portion of the gate conductive portion 44 may be arranged facing the accumulation region 16. At least a partial region of the bottom-side conductive portion 48 is provided at a lower position than the accumulation region 16. The entire bottom-side conductive portion 48 may be provided at a lower position than the accumulation region 16.

The bottom-side conductive portion 48 may be electrically connected to the emitter electrode 52, or may be in an electrically floating state. By providing the bottom-side conductive portion 48 at the bottom portion of the gate trench portion 40, the Miller capacitance between the gate and the collector can be reduced.

The bottom-side conductive portion 48 is not formed in the dummy trench portion 30. The gate trench portion 40 having the bottom-side conductive portion 48 may be at the same depth as the dummy trench portion 30, or may be formed at a deeper position than the dummy trench portion 30. The gate trench portion 40 may have a greater length than the dummy trench portion 30 by at least an amount corresponding to the bottom-side conductive portion 48. In this case, the gate trench portion 40 may have a greater width than the dummy trench portion 30.

Figure 11:
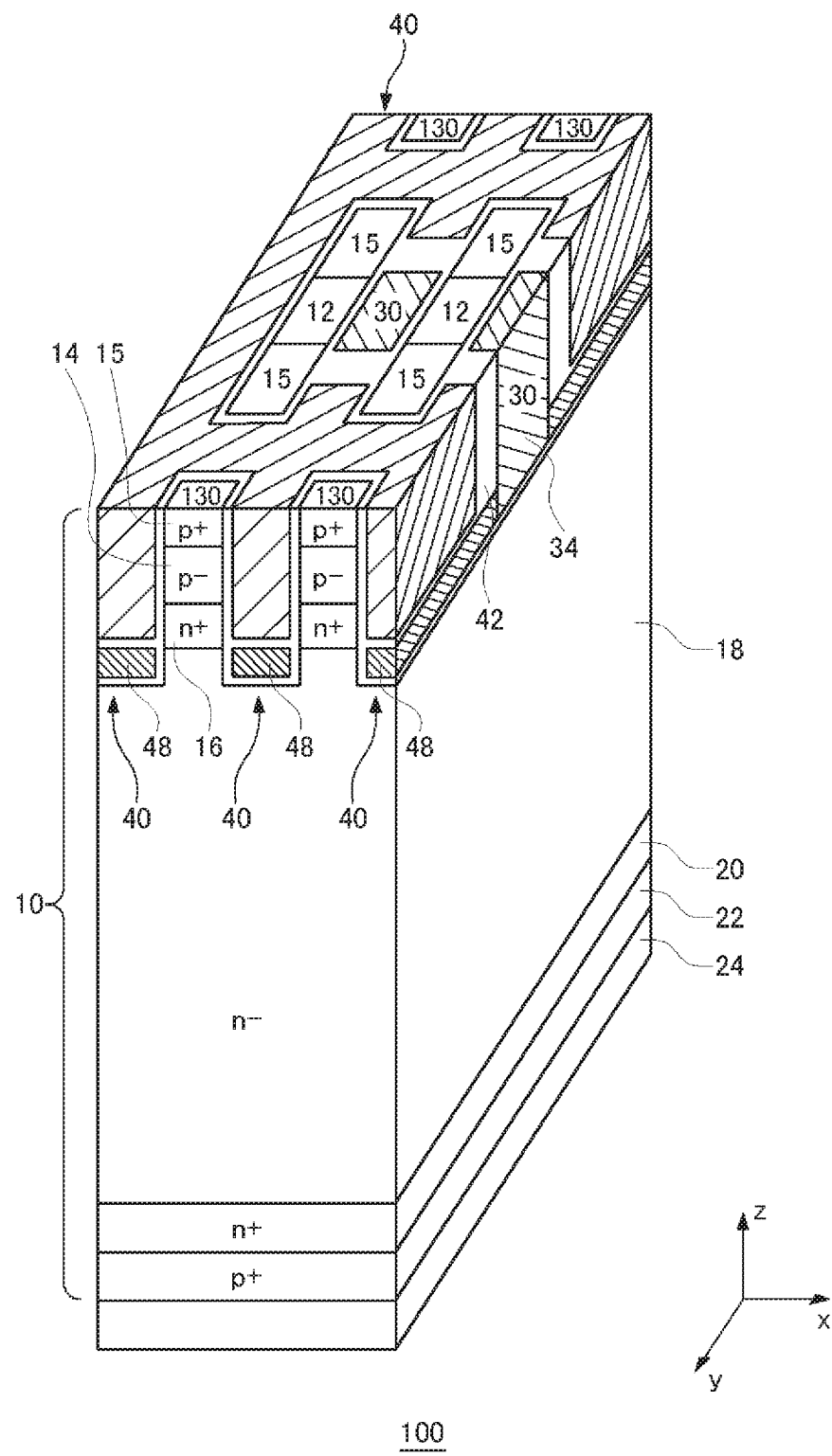
FIG. 11 is a perspective cross-sectional view showing another exemplary configuration of the semiconductor device 100.

FIG. 11 is a perspective cross-sectional view showing another exemplary configuration of the semiconductor device 100. The semiconductor device 100 in the present example further includes a bottom-side conductive portion 48 relative to any of the semiconductor device 100 shown in FIG. 1A to FIG. 9. Other configurations are the same as those of any of the semiconductor device 100 shown in FIG. 1A to FIG. 9. FIG. 11 shows a configuration in which a bottom-side conductive portion 48 is added to the semiconductor device 100 shown in FIG. 8.

The structure of the bottom-side conductive portion 48 is similar to that of the bottom-side conductive portion 48 shown in FIG. 10. Note that the bottom-side conductive portion 48 in the present example is connected to the dummy conductive portion 34 inside the semiconductor substrate 10. More specifically, the bottom-side conductive portion 48 extends from a portion provided below the gate conductive portion 44 toward the dummy conductive portion 34 and is connected to the dummy conductive portion 34. In the present example, the bottom-side conductive portion 48 extends in the y-direction and is connected to the dummy conductive portion 34. Such a configuration makes it possible to set the potential of the bottom-side conductive portion 48 to the emitter potential.

Note that it is preferable that both a portion provided below the gate conductive portion 44 and a portion extending toward the dummy conductive portion 34 of the bottom-side conductive portion 48 are surrounded by the insulating film. It is preferable that a semiconductor region such as the contact region 15 is not arranged between the gate conductive portion 44 and the dummy conductive portion 34. In the present example, an insulating film 42 is provided between the gate conductive portion 44 and the dummy conductive portion 34.

One example of a manufacturing method of the bottom-side conductive portion 48 extending in the array direction as shown in FIG. 11 will now be described. First, a trench extending in the array direction is formed in the front surface of the semiconductor substrate 10. Then, an oxide film is formed to cover the inner wall of the trench.

Then, a polysilicon is formed at the bottom portion of the trench to form bottom portions of the bottom-side conductive portion 48 and the dummy conductive portion 34. Then, an insulating film is formed at the top of the formed polysilicon. Then, the insulating film is removed from a region at which the dummy conductive portion 34 is to be formed, and a polysilicon is formed in the trench. Then, the polysilicon is removed, leaving regions in which the gate conductive portion 44 and the dummy conductive portion 34 are to be formed. That is, a trench for insulation between the gate conductive portion 44 and the dummy conductive portion 34 is formed. The trench is formed extending to the insulating film at the top of the bottom-side conductive portion 48. Finally, an insulating film 42 is formed inside the trench. In this manner, the structure shown in the y-z cross section in FIG. 11 can be formed.

Note that the bottom-side conductive portion 48 may be formed extending to a region in which the gate trench portion 40 and the dummy trench portion 30 are not formed. The bottom-side conductive portion 48 may extend to the outside of the active region. The bottom-side conductive portion 48 may be electrically connected to the emitter electrode 52 at a region in which the gate trench portion 40 and the dummy trench portion 30 are not formed. In this case, the contact hole 54 may not be provided in the operating region 120. Therefore, it becomes easy to miniaturize the semiconductor device 100.

Figure 12:
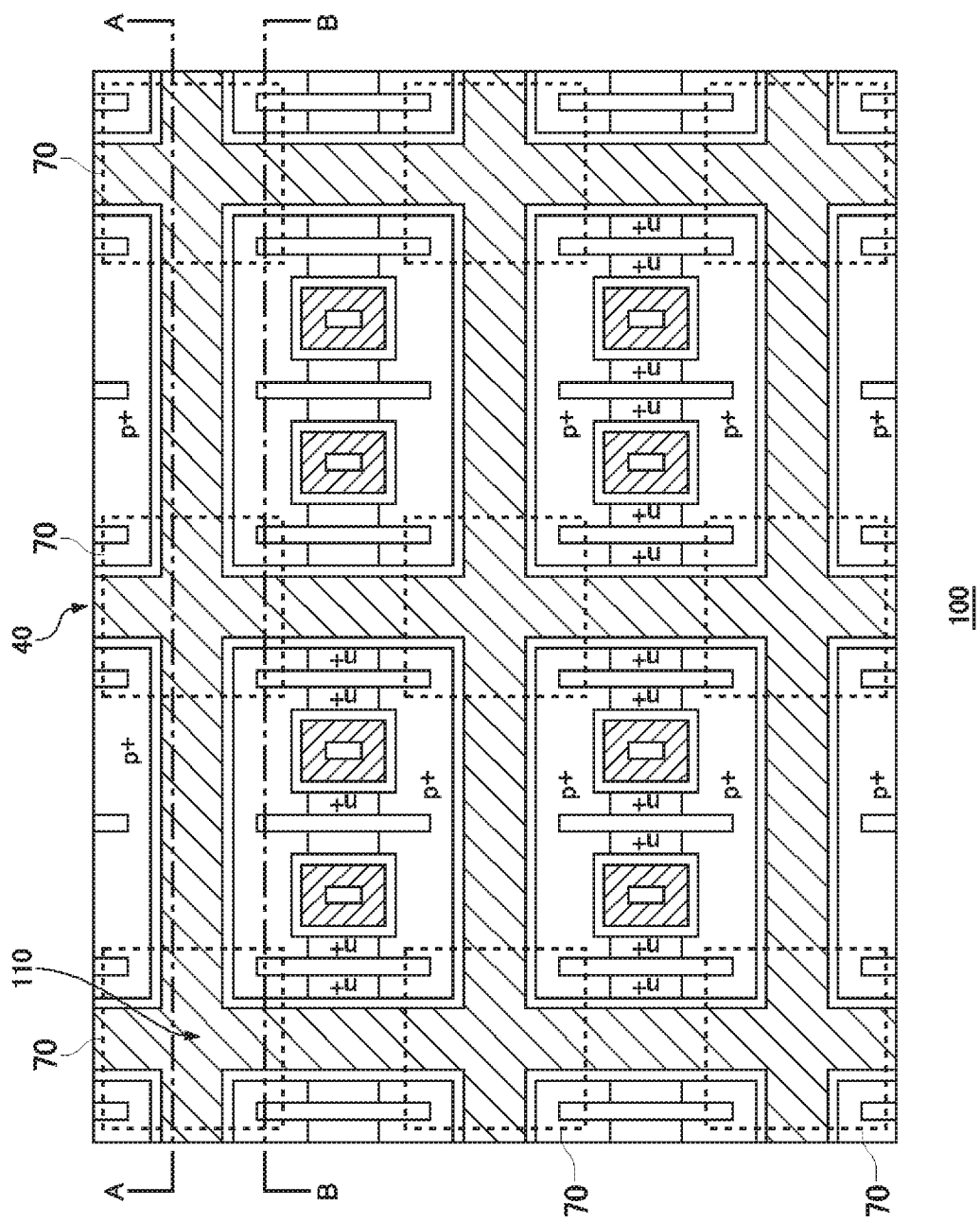
FIG. 12 shows another exemplary configuration of the semiconductor device 100.

FIG. 12 shows another exemplary configuration of the semiconductor device 100. The semiconductor device 100 in the present example further includes a peripheral region 70 relative to the semiconductor device 100 described with reference to the FIG. 1A to FIG. 11. Other structures are the same as those of any of the semiconductor device 100 described with reference to FIG. 1A to FIG. 11. The peripheral region 70 refers to a region in the accumulation region 16 which has a smaller thickness in the depth direction than at the position farthest from the gate trench portion 40 in the x-direction. The peripheral region 70 is arranged around the branch portion 110.

As one example, the peripheral region 70 is arranged surrounding each branch portion 110 in a plane parallel to the front surface of the semiconductor substrate 10. A part of the peripheral region 70 may be formed at a position overlapping with the contact hole 55, or the entire peripheral region 70 may be formed at a position that does not overlap with the contact hole 55.

As in the cross section taken along A-A shown in FIG. 1B, a part of the gate trench portion 40 at the branch portion 110 might be formed at a deeper position than a part of the gate trench portion 40 at other regions. Therefore, electric fields are likely to concentrate at a part of the gate trench portion 40 at the branch portion 110 to cause the avalanche breakdown.

Figure 13:
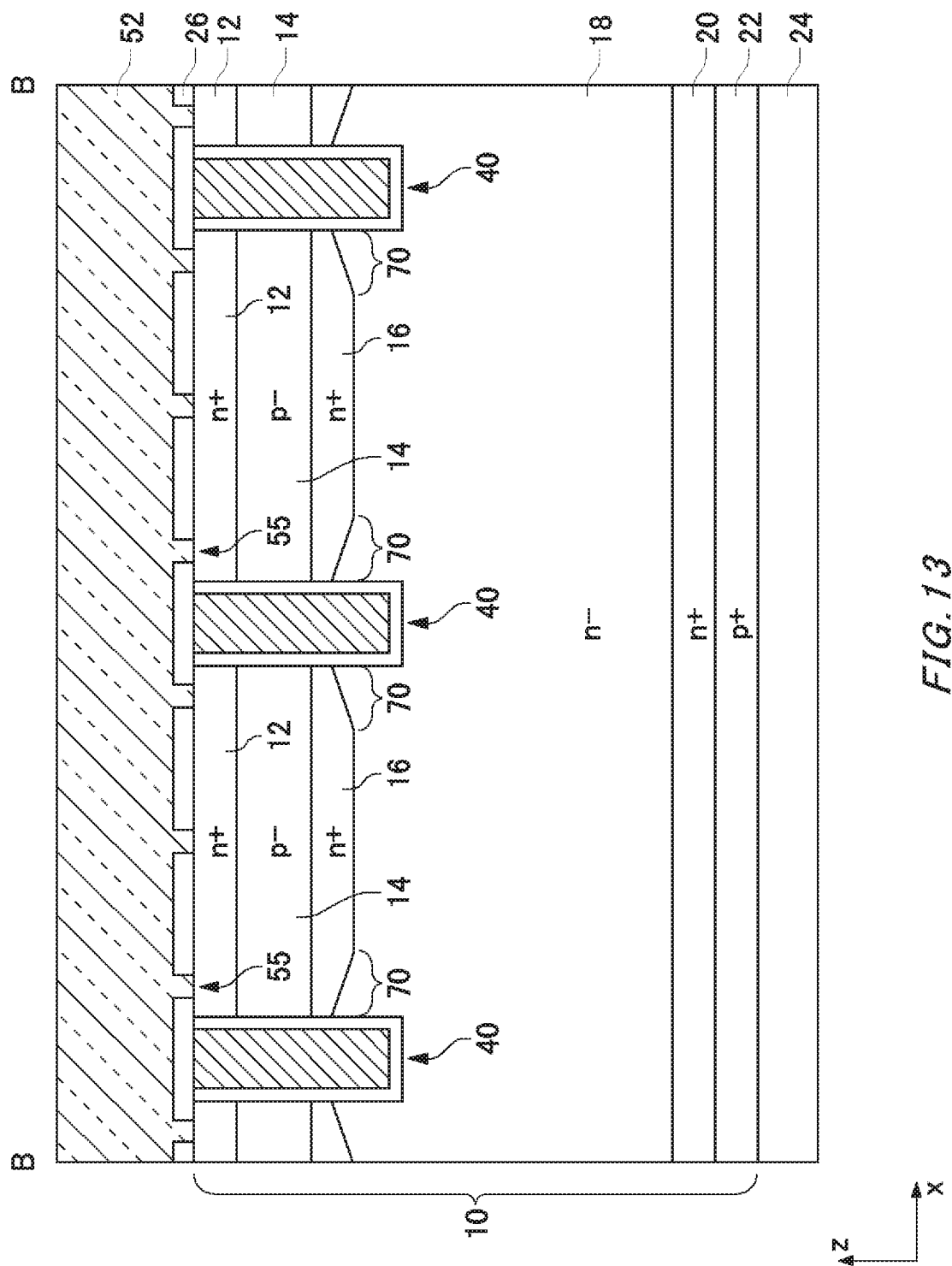
FIG. 13 shows a cross section taken along B-B in FIG. 12.

FIG. 13 shows a cross section taken along B-B in FIG. 12. The cross section taken along B-B corresponds to an x-z cross section including the peripheral region 70. The peripheral region 70 in the present example is a region of the accumulation region 16 adjacent to the gate trench portion 40. The total width in the x-axis direction of the peripheral region 70 provided between two gate trench portions 40 may be smaller or greater than the width in the x-axis direction of other regions of the accumulation region 16. The width in the x-axis direction of the peripheral region 70 may increase as a distance in the y-axis direction from the branch portion 110 decreases. Also, the accumulation region 16 may have a convex shape, at its central portion, protruding further in the (−Z)-direction than the peripheral region 70. The peripheral region 70 may be formed to have a thickness which decreases as a distance from the gate trench portion 40 decreases. The thickness of the peripheral region 70 contacting the gate trench portion 40 may be 80% or less or may be 50% or less of the thickness of the central portion in the x-axis direction of the accumulation region 16.

By providing the peripheral region 70 in the vicinity of the branch portion 110, it becomes easy to extract carriers in the vicinity of the branch portion 110. It is therefore possible to suppress the avalanche breakdown at a part of the gate trench portion 40 at the branch portion 110.

Figure 14:
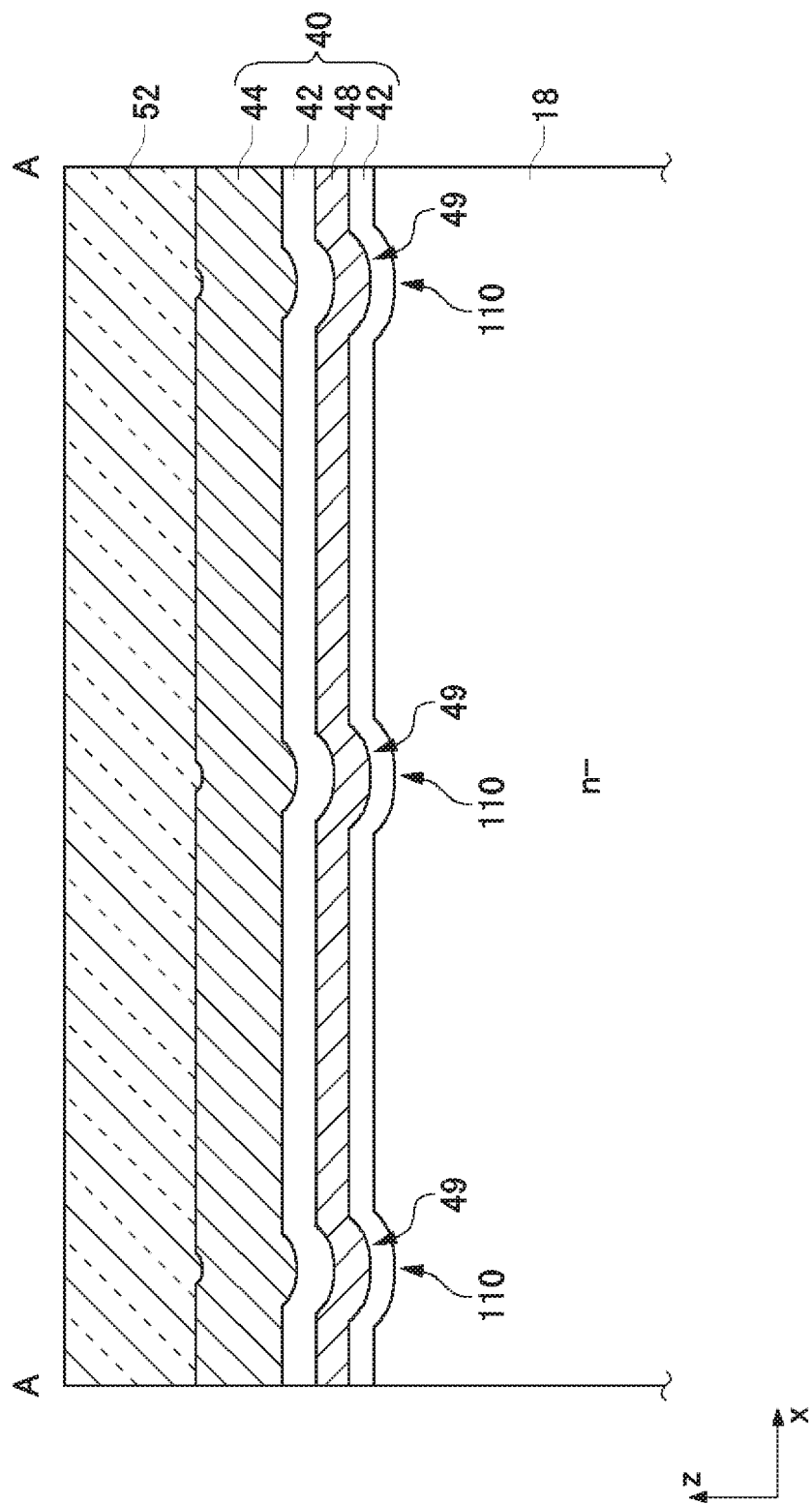
FIG. 14 shows another example of the cross section taken along A-A.

FIG. 14 shows another example of the cross section taken along A-A. The semiconductor device 100 in the present example includes a bottom-side conductive portion 48 in the gate trench portion 40, in like manner as the semiconductor device 100 shown in FIG. 10 or FIG. 11. Other structures are similar to those structures of any of the semiconductor device 100 shown in FIG. 1A to FIG. 13.

The bottom-side conductive portion 48 in the present example has a protruding region 49 which protrudes downward at the branch portion 110. The protruding region 49 is formed being integral with other regions of the bottom-side conductive portion 48. The protruding region 49 may protrude downward by the same length as a length by which the branch portion 110 protrudes downward. Such a configuration allows the protruding region 49 to function as a field plate, making it possible to mitigate electric field concentration at the bottom portion of the branch portion 110.

Figure 15:
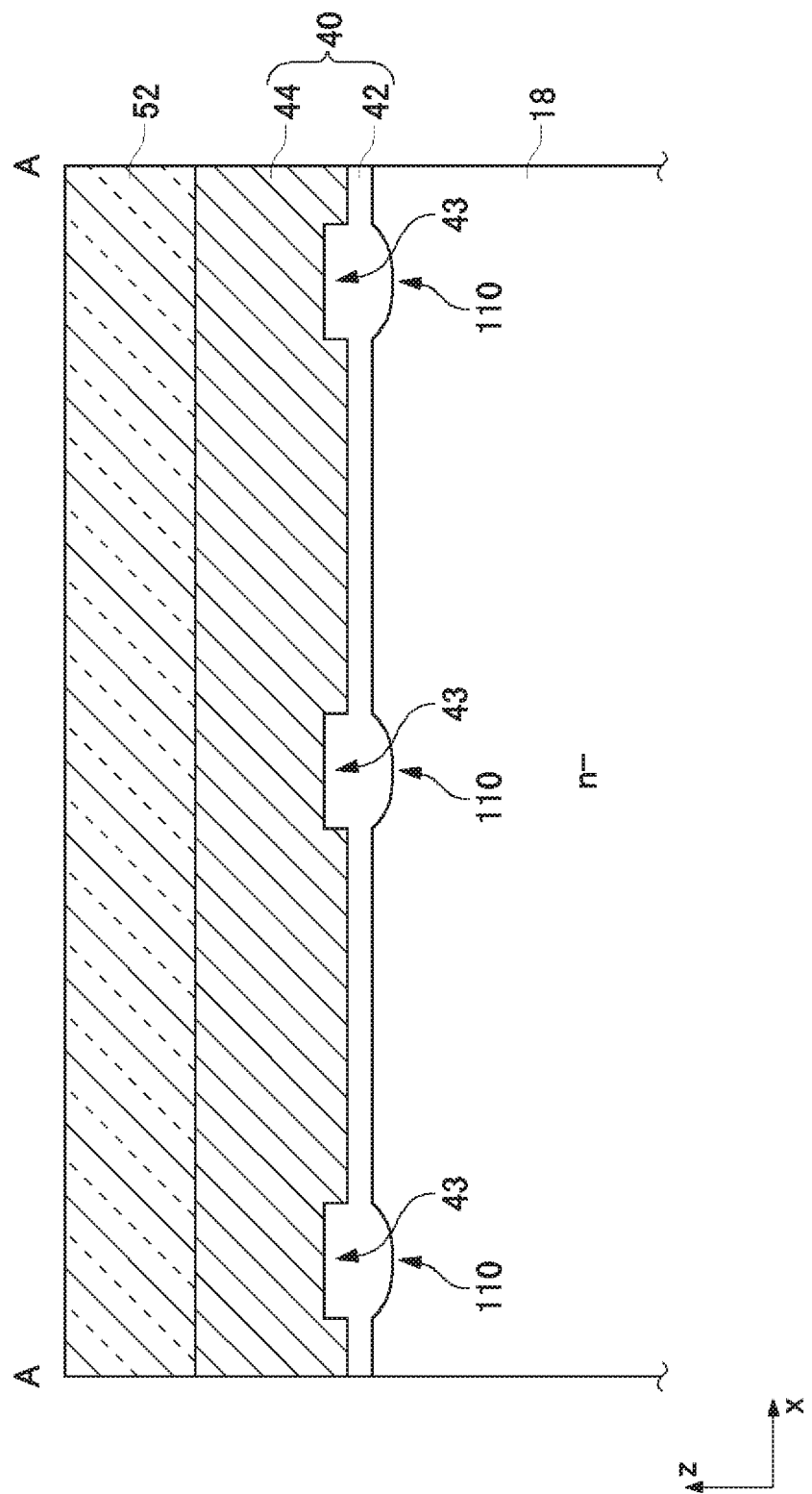
FIG. 15 shows another example of the cross section taken along A-A.

FIG. 15 shows another example of the cross section taken along A-A. The semiconductor device 100 in the present example has a similar structure to any of the semiconductor device 100 shown in FIG. 1A to FIG. 9 except for the structure of the insulating film 42.

The insulating film 42 in the present example has a thick-film region 43 at the bottom portion of the branch portion 110. The thick-film region 43 has a greater thickness than a part of the insulating film 42 at bottom portions of the gate trench portion 40 other than at the branch portion 110. The thickness of the thick-film region 43 may be two or more times greater than that of other bottom regions of the insulating film 42. The maximum value of the thickness of the insulating film 42 at the bottom portion of the branch portion 110 may be used as the thickness of the thick-film region 43. The average value of the thickness of the insulating film 42 at bottom portions other than the branch portion 110 may be used as the thickness of the insulating film 42 at other bottom regions. Such a configuration makes it possible to increase the breakdown voltage of the gate trench portion 40 at the bottom portion of the branch portion 110.

Also, in each semiconductor device 100 shown in FIG. 1A to FIG. 15, the gate conductive portion 44 may be connected to the emitter electrode and the dummy conductive portion 34 may be connected to the gate metal layer. That is, the gate conductive portion 44 may function as a dummy electrode and the dummy conductive portion 34 may function as a gate metal layer. Such a configuration also makes it possible to separate the branch portion 110 and a region in which a channel is formed from each other.

Note that, in the semiconductor device 100 shown in FIG. 10, FIG. 11 and FIG. 14, if the gate and the emitter are switched as described above, the bottom-side conductive portion 48 would be formed below the dummy conductive portion 34. Also, in the semiconductor device 100 shown in FIG. 11, the bottom-side conductive portion 48 formed below the dummy conductive portion 34 would extend in a direction toward the gate conductive portion 44 and would be connected to the bottom portion of the gate conductive portion 44.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a first conductivity-type semiconductor substrate;
a second conductivity-type base region provided at a front surface side of the semiconductor substrate;
a first trench portion provided extending from a front surface of the semiconductor substrate and penetrating the base region; and
a second conductivity-type contact region which is provided in a part of the base region at the front surface side of the semiconductor substrate and has a higher impurity concentration than the base region, wherein:
the first trench portion comprises a branch portion on the front surface of the semiconductor substrate;
the branch portion is provided being surrounded by the contact region on the front surface of the semiconductor substrate;
the first trench portion is formed surrounding a plurality of operating regions on the front surface of the semiconductor substrate;
the semiconductor device further comprises a plurality of non-contiguous second trench portions that are non-contiguous with one another and which are formed in each of the plurality of operating regions on the front surface of the semiconductor substrate and are separated from the first trench portion;
the first trench portion is a gate trench portion connected to a gate metal layer, and the plurality of non-contiguous second trench portions are non-contiguous dummy trench portions connected to an emitter electrode;
a first conductivity-type emitter region is formed in each of the plurality of operating regions in which the plurality of non-contiguous dummy trench portions are formed; and
wherein on the front surface of the semiconductor substrate, a distance from the branch portion to the emitter region is greater than a distance from the branch portion to the contact region.

2. The semiconductor device according to claim 1, further comprising an interlayer insulating film formed above the front surface of the semiconductor substrate, wherein the interlayer insulating film comprises a contact hole which is positioned facing each of the plurality of operating regions and exposes at least a portion of the emitter region and the contact region.

3. The semiconductor device according to claim 1, wherein the gate trench portion is formed surrounding each of one or more extraction regions on the front surface of the semiconductor substrate, and the emitter region is not formed in each of the extraction regions.

4. The semiconductor device according to claim 3, wherein the extraction regions are arranged adjacent to the operating regions with the gate trench portion intervening therebetween.

5. The semiconductor device according to claim 4, wherein two of the extraction regions are arranged at both sides of each of the operating regions.

6. The semiconductor device according to claim 1, wherein the gate trench portion comprises a protruding portion which protrudes toward the dummy trench portion.

7. The semiconductor device according to claim 1, wherein the gate trench portion comprises:

an insulating film formed on an inner wall of a gate trench provided extending from the front surface of the semiconductor substrate and penetrating the base region;

a gate conductive portion formed inside the gate trench with its inner wall covered by the insulating film; and a bottom-side conductive portion which is formed inside the gate trench with its inner wall covered by the insulating film and at a position closer to a bottom portion of the gate trench than the gate conductive portion and is insulated from the gate conductive portion.

8. The semiconductor device according to claim 7, wherein the dummy trench portion comprises:

an insulating film formed on an inner wall of a dummy trench provided extending from the front surface of the semiconductor substrate and penetrating the base region; and a dummy conductive portion formed inside the dummy trench with its inner wall covered by the insulating film, wherein the bottom-side conductive portion is connected to the dummy conductive portion inside the semiconductor substrate.

9. The semiconductor device according to claim 7, wherein the bottom-side conductive portion comprises a protruding region which protrudes downward at the branch portion.

10. The semiconductor device according to claim 1, wherein the first trench portion comprises an insulating film formed on an inner wall of a trench provided extending from the front surface of the semiconductor substrate and penetrating the base region, and a thickness of the insulating film at a bottom portion of the branch portion of the first trench portion is greater than a thickness of the insulating film at a bottom portion of a part of the first trench portion other than the branch portion.

11. The semiconductor device according to claim 1, further comprising an accumulation region formed below the base region in the semiconductor substrate, wherein the first trench portion is provided penetrating the accumulation region.

12. The semiconductor device according to claim 11, wherein a peripheral region is provided in the accumulation region and surrounding the branch portion, wherein at the peripheral region, a thickness of the accumulation region in a depth direction at a position contacting the first trench portion is smaller than a thickness of the accumulation region at a position farthest from adjacent first trench portions in a direction parallel to the front surface of the semiconductor substrate.

13. A semiconductor device comprising:

a first conductivity-type semiconductor substrate;

a second conductivity-type base region provided at a front surface side of the semiconductor substrate;

a first trench portion provided extending from a front surface of the semiconductor substrate and penetrating the base region; and a second conductivity-type contact region which is provided in a part of the base region at the front surface side of the semiconductor substrate and has a higher impurity concentration than the base region, wherein:

the first trench portion comprises a branch portion on the front surface of the semiconductor substrate;

the branch portion is provided being surrounded by the contact region on the front surface of the semiconductor substrate;

the first trench portion is formed surrounding each of a plurality of operating regions on the front surface of the semiconductor substrate;

the semiconductor device further comprises a plurality of non-contiguous second trench portions that are non-contiguous with one another and which are formed in each of the plurality of operating regions on the front surface of the semiconductor substrate and are separated from the first trench portion;

a first conductivity-type emitter region formed in the plurality of operating regions in which the second trench portion is formed;

the second trench portion and the plurality of operating regions are surrounded by the first trench portion on the front surface of the semiconductor substrate;

the emitter region is provided in contact with the second trench portion;

the first trench portion is a gate trench portion connected to a gate metal layer, and the plurality of non-contiguous second trench portions are non-contiguous dummy trench portions connected to an emitter electrode; and wherein on the front surface of the semiconductor substrate, a distance from the branch portion to the emitter region is greater than a distance from the branch portion to the contact region.

* * * * *